United States Patent [19]
Komatsu

[11] Patent Number: 5,508,132
[45] Date of Patent: Apr. 16, 1996

[54] PHOTO MASK

[75] Inventor: Masaya Komatsu, Tokyo, Japan

[73] Assignee: Nikon Corporation, Tokyo, Japan

[21] Appl. No.: 272,861

[22] Filed: Jul. 8, 1994

Related U.S. Application Data

[63] Continuation of Ser. No. 59,517, May 11, 1993, abandoned, which is a continuation of Ser. No. 867,814, Apr. 13, 1992, abandoned.

[30] Foreign Application Priority Data

Apr. 15, 1991 [JP] Japan ..................................... 3-108179

[51] Int. Cl.$^6$ ....................................................... G03F 9/00
[52] U.S. Cl. .................................................. 430/5; 430/320
[58] Field of Search ..................................... 430/5, 320

[56] References Cited

U.S. PATENT DOCUMENTS 5,045,417  9/1991  Okamoto ..................................... 430/5
5,114,813  5/1992  Smoot et al. ............................... 430/5

FOREIGN PATENT DOCUMENTS 62-50811  10/1987  Japan.

*Primary Examiner*—Mark Chapman
*Attorney, Agent, or Firm*—Michael N. Meller

[57] ABSTRACT

A phase-shifted photo mask capable of discrimination between phase shifting portions and a transparent portion (a bare surface portion of a substrate) by microscope observation with visible light. An SOG (spin-on-glass) layer mixed with inorganic colored ions ($Co^{2+}$, $Mn^{3+}$, $Ni^{2+}$ or the like) having an absorption characteristic to the visible light is formed on the surface of the substrate which is substantially transparent to an exposure light (ultraviolet light) and the undesired portions of the SOG layer excluding the portions which are to form the phase shifting portions are removed.

10 Claims, 2 Drawing Sheets

PHOTO MASK

This is a continuation of application Ser. No. 08/059,517, filed May 11, 1993 now abandoned, which is a continuation of application Ser. No. 867,814, filed Apr. 13, 1992 now abandoned.

BACKGROUND OF THE INVENTION

1. Field of the Invention

The present invention relates to a photo mask (also referred to as a reticle) which is used as a projection negative in the lithographic operation for the manufacture of semiconductor devices, and more particularly the invention relates to the improvements in and relating to a phase-shifted photo mask which includes phase shifting portions for changing the phase of a transmitted light.

2. Description of the Prior Art

Photo masks of the type heretofore used as a projection negative in the lithographic operation for the manufacture of semiconductor devices has been generally constructed so that a light shielding pattern of a metal such as chromium is formed on a glass substrate and the photo mask is composed of only a transparent portion and light shielding portions. Therefore, it is suffice for the inspection of defects in such photo mask to check the light shielding portions as to their arrangement and the presence of defects and undesired projections.

For instance, in the case of an inspection method for detecting the defects through the microscope observation of a photo mask by visible-light transmission illumination, it is only necessary to discriminate the light and shade in an image of the pattern formed on the photo mask. Also, when effecting an inspection by means of falling irradiation illumination, the reflected light from the light shielding portions is far greater in intensity than the reflected light from the transparent portion thus making it easy to effect the detection of defects on the basis of the light and shade of the image as in the case of the transmission illumination.

On the other hand, as photo masks designed to cope with the recent trend toward finer circuit patterns, there have been proposed various phase-shifted masks in which phase shifting portions for changing the phase of a transmitted light are provided at specified locations of a transparent portion thereby enhancing the contrast of a projected image. For instance, Japanese Patent Publication No. 62-50811 discloses a technique concerning a phase-shifted mask based on a spatial frequency modulating method.

However, the phase-shifted masks heretofore proposed have the following disadvantages with respect to the inspection of defects.

With the phase-shifted mask, it is necessary to inspect the arranged positions as well as the presence of damages and undesired projections with respect to not only the light shielding portions but also the phase shifting portions. Moreover, the thickness of the phase shifting portions must be inspected since the phase-shifting portions must be formed to a thickness which is determined by an equation $d=\{\lambda/2\pi\ (n-1)\}\phi$ (where $\lambda$ is the wavelength of exposure light and n is the refractive index of the phase shifting portions) with $\phi$ representing the desired phase difference.

However, the phase shifting portions are generally made of a plastic material such as PMMA (polymethyl methacrylate) or glass such as $SiO_2$ or SOG (spin-on-glass)(or a quasi-glass material) so that they are transparent to light ranging from the ultraviolet region to the visible region and they are practically equal in optical characteristics with the substrate (generally made of a synthetic quartz). Therefore, it is extremely difficult to observe the phase shifting portions by microscope observation with visible light and no thickness inspecting method is known in the art.

SUMMARY OF THE INVENTION

The present invention has been made in view of the foregoing deficiencies in the prior art and it is the primary object of the invention to provide a phase-shifted mask which can be easily inspected for defects.

To accomplish the above object, in accordance with one aspect of the present invention there is thus provided a photo mask including at least a transparent portion which is substantially transparent to an exposure light of a given wavelength range and phase shifting portions for changing the phase of the exposure light whereby at least either one of the transparent portion and the phase shifting portions includes a substance for causing the transparent portion and the phase shifting portions to relatively differ in light transmission characteristic in the other wavelength ranges than the wavelength range of the exposure light.

In accordance with another aspect of the present invention, there is provided a photo mask including at least a transparent portion which is substantially transparent to an exposure light of a given wavelength range, light shielding portions for practically intercepting the exposure light and phase shifting portions for changing the phase of the exposure light whereby at least either one of the transparent portion and the phase shifting portions includes a substance for relatively changing the transparent portion and the phase shifting portions in light transmission characteristic in the other wavelength ranges than the wavelength range of the exposure light.

In accordance with still another aspect of the present invention, there is provided a photo mask including a transparent portion which is substantially transparent to an exposure light of a given wavelength range, phase shifting portions for changing the phase of the exposure light and an inorganic substance contained in one or the other of the transparent portion and the phase shifting portions whereby the transparent portion and the phase shifting portions are relatively differed in light transmission characteristic in the other wavelength ranges than the wavelength range of the exposure light.

With the photo mask according to the present invention, its defect inspection can be effected in the following manner. In other words, by effecting the transmission illumination and microscope observation of the photo mask with light of a wavelength range in which the phase shifting portions are different in light transmission characteristic from the substrate (e.g., a wavelength range in which the phase shifting portions are lower in transmittance than the substrate), the light of a given wavelength range is attenuated by absorption in the phase shifting portions and the phase shifting portions appear to have been colored differently from the transparent portion (the substrate bare surface portion to which the phase shifting portions are not added), thus making it easy to discriminate the transparent portion and the phase shifting portions from each other. Thus, with the photo mask according to the present invention, it is possible to easily detect the positions, damages, etc., of the phase shifting portions by use of the conventional inspection apparatus.

In addition, since the amount of light absorbed by the phase shifting portion is decreased in the part which is small in film thickness and increased in the part which is large in film thickness, even the same phase shifting portion appears to be different in coloring among its different parts depending on the film thickness. Therefore, the thickness of the phase shifting portions can also be checked easily. For instance, it is possible to preliminarily store the color tone of the phase shifting portions obtained by microscope observation of a photo mask capable of producing a high-contrast image during the actual projection exposure so that a comparison between this reference color and the color of the phase shifting portions to be inspected shows not only the presence of any film thickness variations of the phase shifting portions but also whether their film thicknesses are in conformity with the design value.

In accordance with the present invention, the substance for causing the transparent portion and the phase shifting portions to differ in absorption characteristic in the wavelength ranges other than the exposure light wavelength range is not limited in any way, and the transmission characteristic of either one of the transparent portion and the phase shifting portions may be changed. As an example of the concrete methods, if, for instance, the exposure light wavelength is in the ultraviolet region, there is the method of adding to the phase shifting portions an inorganic substance having a specific absorption band to light of the wavelengths in the visible region (400 nm to 700 nm).

Thus, the addition of an inorganic substance having a specific absorption band to visible light to one or the other of the transparent portion and the phase shifting portions of the phase-shifted mask is not only effective for the inspection of the phase-shifted mask for defects but also has the effect of stabilizing the mask to the exposure light in the ultraviolet region or the like, thereby imparting a high degree of durability to the mask without deteriorating its optical performance.

In this case, it is necessary to give consideration such that no considerable difference is caused in light transmission characteristic at the exposure light wavelength between the transparent portion and the phase shifting portions. Since the phase-shifted mask is designed to enhance the contrast of a projected image by virtue of an interference between the exposure light transmitted through the transparent portion and the exposure light transmitted through the phase shifting portions, their amounts of transmitted light should preferably be substantially equal to each other from the standpoint of the interference effect of the transmitted light through the transparent portion and the phase shifting portions, respectively. Note that colored ions should preferably be used as the inorganic substance.

As described hereinabove, in accordance with the present invention the transparent portion and the phase shifting portions of the photo mask are different in light transmission characteristic from each other in the other wavelength ranges than the exposure light wavelength range so that if the microscope observation is effected with light containing wavelength ranges of different transmission characteristics, the transparent portion and the phase shifting portions are observed in differently colored forms thereby ensuring easy discrimination between the two. Also, even in the same phase shifting portion, the color tone of its parts differs from one another depending on the film thickness and therefore the film thickness of the phase shifting portion can be checked.

Thus, by providing the conventional mask defect inspection apparatus with color CCD units or the like so as to subject the information of a mask to be inspected to color separation and image processing, the automatic detection of defects in masks is made possible. Moreover, by detecting the tones of the colors resulting from the color separation, it is possible to quantitatively detect the film thickness of the phase shifting portions, etc.

Therefore, the photo mask according to the present invention can easily effect the defect inspection by utilizing the conventional mask inspection apparatus and without any specific inspection apparatus and it has a remarkable industrial utility value.

The above and other objects, features and advantages of the present invention will become fully apparent from the following detailed description of its embodiments taken in conjunction with the accompanying drawings.

DESCRIPTION OF THE PREFERRED EMBODIMENTS

FIGS. 1a to 1d show the steps for producing a photo mask according to an embodiment of the present invention. The present embodiment will be described by taking the case of a photo mask which is adapted for use with the i line having a wavelength of 365 nm and having phase shifting portions made of SOG.

This SOG is a coating agent which is widely used in cases where a flat insulating film is formed on a surface having irregularities as well as in the multiple layer resist process and it is converted to a quasi-glass substance when sintered after its application. Therefore, if the SOG in its solution state is mixed with an impurity capable of absorption at a given range of wavelengths, applied to attain the desired thickness and then sintered, the transmission characteristic can be changed easily.

Figure 2:
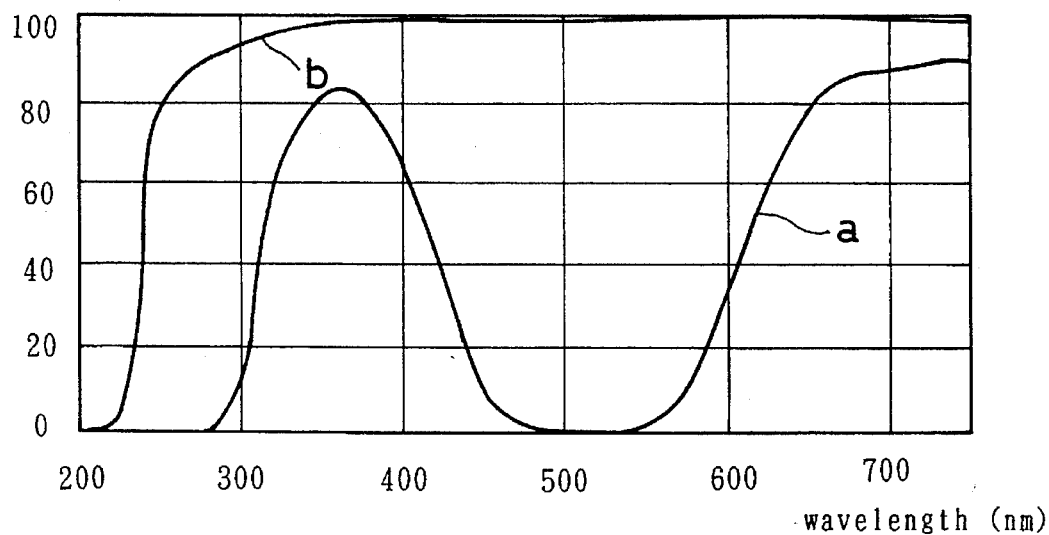
FIG. 2 is a graph showing the transmittance characteristic of colored ions having an absorption characteristic in the visible region and the transmittance characteristic of the ordinary phase shifting portions (or the substrate).

Then, the methods of mixing an impurity into the glass (quasi-glass substance) for coloring purposes can be roughly divided into two classes. The first method attains the coloring by the absorption of colored ions, and the second method attains the coloring due to the scattering by colloidal particles. However, the coloring by the second method is not preferable since a considerable detrimental effect is also produced on the transmission characteristic to the exposure light. With the coloring based on the first method, it is possible to find several kinds of colored ions suitable for the inorganic substance having an absorption characteristic to the light of wavelengths in the visible region. For instance, the use of such colored ions as $Co^{2+}$, $Mn^{3+}$ or $Ni^{2+}$ provides an absorption band in the central portion of the visible region as indicated by a curve a in FIG. 2 and the glass appears to have colored blue when observed with white visible light. In FIG. 2, the curve a represents the transmittance characteristic for the colored ions having an absorption characteristic in the visible region, and a curve b represents the transmittance characteristic of the ordinary phase shifting portions (or the substrate). When mixing such colored ions with the SOG, it is only necessary that such colored ions are added in the form of an oxide such as CoO, $Mn_2O_3$ or NiO and then sintered.

The production method of the photo mask according to the embodiment will now be described in greater detail with reference to FIGS. 1a to 1d.

Figure 1A:
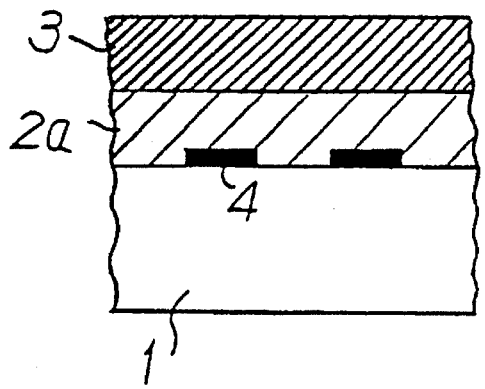
FIGS. 1a to 1d are sectional views showing schematically the steps for producing a photo mask according to an embodiment of the present invention.

In FIG. 1a, a light shielding pattern (light shielding portions 4) made of chromium or the like is formed on a substrate 1 which is transparent to an exposure light. In order to form a phase shifting portion 2 at each of specified locations on the substrate 1 (between the two light shielding portions 4 in the case of FIG. 1), an oxide of the previously mentioned colored ions is first added and mixed with an SOG in molten state, applied onto the pattern containing surface of the substrate 1 to the desired thickness and then sintered.

Figure 1B:
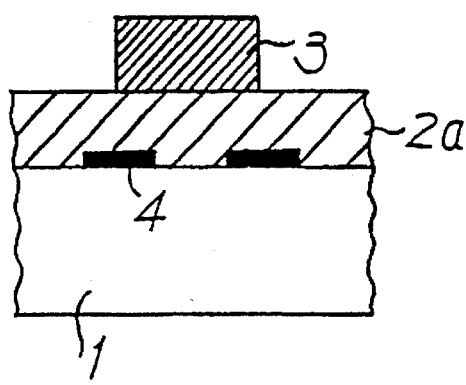
Figure 1C:
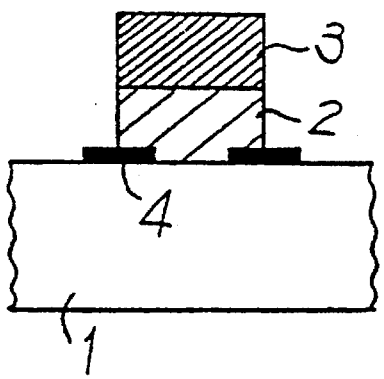
Figure 1D:
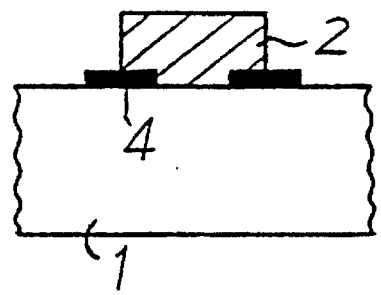

Then, as shown in FIG. 1a, an EB (electron beam) resist 3 is applied onto the sintered colored ion-containing SOG layer 2a so that after an electron beam 5 has been irradiated through a mask (not shown) corresponding to the configuration of the phase shifting portions or the electron beam 5 has been scanned so as to sensitize the phase shifting portions, the resist 3 is developed to form the desired resist pattern as shown in FIG. 1b. Thereafter, as shown in FIG. 1c, the portions of the colored ion-containing SOG layer 2, which are not protected by the EB resist 3, are removed by RIE (reactive ion etching; reactive ion beam 6) to form the phase shifting portions 2 of the desired shape. Lastly, the EB resist 3 is removed thereby producing a photo mask according to the present embodiment (FIG. 1d).

Next, the construction designed for causing the transparent portion and the phase shifting portions to differ in transmission characteric in the other wavelength ranges than the exposure light wavelength range will be described with reference to a case other than the above-mentioned embodiment.

Firstly, while the phase shifting portions are made of SOG in the above-mentioned embodiment, the invention is not limited thereto so that as for example, such plastic as PMMA may be used and in this case the coating fluid may be mixed with colored ions to control the transmission characteristic.

Also, where the film for forming the phase shifting portions is formed by such thin film forming technique as vapor deposition, CVD or sputtering, it is only necessary that a colored ion oxide is concurrently used as a vapor-deposited specimen or target thereby simultaneously depositing the colored ions.

Figure 3:
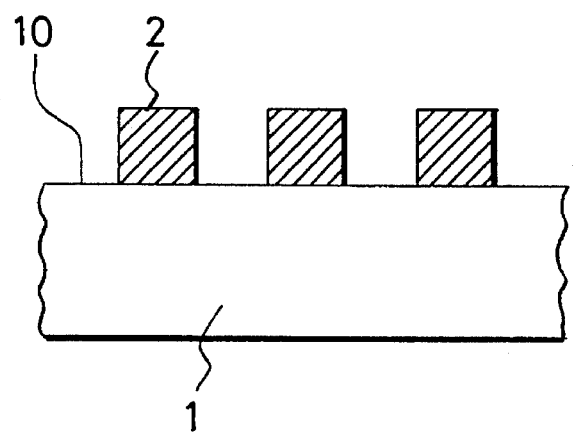
FIG. 3 is a sectional view showing schematically a phase-shifted mask having grooves formed in a substrate which is transparent to an exposure light.

On the other hand, in the case of a photo mask so constructed that instead of adding a separate film as phase shifting portions onto a substrate, phase shifting portions 2 are formed by providing projections and grooves on the surface of a substrate as shown in FIG. 3, it is possible for example to implant colored ions into a transparent portion 10 or the locations corresponding to the phase shifting portions 2 on the surface of a substrate 1 by an ion implantation technique so as to partially change the optical characteristics and thereby to cause the two to differ in transmission characteristic from each other. Of course, even in the case of a photo mask of the construction in which a separate film is added as phase shifting portions as shown in FIG. 1, it is possible to use the method of changing the optical characteristic of the transparent portions or the locations corresponding to the phase shifting portions on the surface of the substrate.

Further, it is needless to say that where the wavelength of an exposure light permits the selection of two substances which are substantially transparent at the exposure light wavelength and are different in transmission characteristic in the other ranges than the exposure light wavelength range, it is only necessary that one of the substances forms a substrate (transparent portion) and the other substance forms phase shifting portions without having recourse for example to the method of implanting an impurity. In this case, the transparent portion and the phase shifting portions need not always be different in transmission characteristic with respect to the visible light, that is, it is only necessary that where the two are different in transmission characteristic in the infrared region, the defect inspection is effected by using an infrared image pickup device.

What is claimed is:

1. A photo mask comprising:

a transparent portion substantially transparent to an exposure light of a predetermined exposure light wavelength range; and a phase shifting portion for changing a phase of said exposure light transmitted through said phase shifting portion, wherein said transparent portion and said phase shifting portion are equal to each other in light transmission characteristic within said exposure light wavelength range and are relatively different in light transmission characteristic in a second wavelength range which is different from said exposure light wavelength range.

2. A photo mask according to claim 1, wherein said phase shifting portion contains colored ions having a light. absorption characteristic in said second wavelength range.

3. A photo mask according to claim 2, wherein said colored ions are selected from a group consisting of $Co^{2+}$, $Mn^{3+}$ and $Ni^{2+}$.

4. A photo mask according to claim 1, wherein said transparent portion contains colored ions having a light absorption characteristic in said second wavelength range.

5. A photo mask according to claim 4, wherein said colored ions are selected from a group consisting of $Co^{2+}$, $Mn^{3+}$ and $Ni^{2+}$.

6. A photo mask comprising:

a transparent portion substantially transparent to an exposure light of a predetermined exposure light wavelength range;

a light shielding portion for substantially blocking said exposure light; and a phase shifting portion for changing a phase of said exposure light transmitted through said phase shifting portion, wherein said transparent portion and said phase shifting portion are equal to each other in light transmission characteristic within said exposure light wavelength range and are relatively different in light transmission characteristic in a second wavelength range which is different from said exposure light wavelength range.

7. A photo mask according to claim 6, wherein said phase shifting portion contains colored ions having a light absorption characteristic in said second wavelength range.

8. A photo mask according to claim 7, wherein said colored ions are selected from a group consisting of $Co^{2+}$, $Mn^{3+}$ and $Ni^{2+}$.

9. A photo mask according to claim 6, wherein said transparent portion contains colored ions having a light absorption characteristic in said second wavelength range.

10. A photo mask according to claim 9, wherein said colored ions are selected from a group consisting of $Co^{2+}$, $Mn^{3+}$ and $Ni^{2+}$.

\* \* \* \* \*